United States Patent [19]

Mitchell et al.

[11] 4,382,286

[45] May 3, 1983

[54] METHOD AND APPARATUS FOR COMPRESSING AND DECOMPRESSING STRINGS OF ELECTRICAL DIGITAL DATA BITS

[75] Inventors: Joan L. Mitchell, Ossining, N.Y.; Peter Quarendon, Romsey, England

[73] Assignee: International Business Machines Corporation, Armonk, N.Y.

[21] Appl. No.: 164,120

[22] Filed: Jun. 30, 1980

[30] Foreign Application Priority Data

Oct. 2, 1979 [GB] United Kingdom ............... 7934097

[51] Int. Cl.³ ............................................. G06F 5/00
[52] U.S. Cl. ............................. 364/900; 340/347 DD
[58] Field of Search ............... 364/200, 900; 340/728, 340/347 DD; 358/133, 260, 261

[56] References Cited

U.S. PATENT DOCUMENTS

| | | | |
|---|---|---|---|
| 2,921,124 | 1/1960 | Graham | 340/728 |
| 3,394,352 | 7/1968 | Wernikoff et al. | 364/900 X |
| 3,636,520 | 1/1972 | Berteau | 364/200 |
| 3,694,813 | 9/1972 | Lott et al. | 364/200 |
| 3,717,851 | 2/1973 | Cocke et al. | 364/200 |
| 3,883,847 | 5/1975 | Frank | 364/900 |
| 3,895,357 | 7/1975 | Schwartz et al. | 364/200 |
| 3,946,365 | 3/1976 | Bantner | 364/200 |
| 4,021,782 | 5/1977 | Hoerning | 364/900 |
| 4,064,489 | 12/1977 | Babb | 364/200 |

FOREIGN PATENT DOCUMENTS 2889671  11/1972  Australia .

*Primary Examiner*—James D. Thomas
*Assistant Examiner*—David Y. Eng
*Attorney, Agent, or Firm*—Roy R. Schlemmer, Jr.

[57] ABSTRACT

A compression technique for a character graphics system in which character cell definition bit strings are transmitted from a central processing unit to a display unit. Each cell is divided into a number of slices and each slice into digits. A test is made on whether to compress on a comparison with an all zero slice, the previous slice or the previous slice but one, depending upon the number of digit mismatches that occur when the comparison occurs. Slices are then compressed by comparing each digit with the corresponding digit in the comparison slice and generating a single 0 bit if the digit matches and including a 1 bit and the whole digit if a mismatch occurs. The compression in the central processing unit and the decompression in the display unit is implemented in microcoded routines.

6 Claims, 6 Drawing Figures

METHOD AND APPARATUS FOR COMPRESSING AND DECOMPRESSING STRINGS OF ELECTRICAL DIGITAL DATA BITS

TECHNICAL FIELD

This invention relates to mehods and apparatus for compressing and decompressing strings of electrical digital data bits, for use particularly when such bit strings are to be transmitted from one location to another or when they are to be stored in an electrical data storage device.

The use of interactive data processing systems in which input-output terminals are connected to central processing units over data communication links requires a continuous transmission of data between the units of the system. When the data processing system implements an interactive graphic display system then the time taken to transmit the data bit strings required to define a picture is a significant portion of the time delay between a user requesting a picture and the picture appearing on a display unit.

BACKGROUND ART

Many different methods for compressing bit strings have been proposed in the past and the following United Kingdom and United States of America patent specifications are quoted as examples.

British Pat. No. 1,534,069 (IBM) 'Translating Apparatus'

British Pat. No. 1,328,061 (IBM) 'Data Processing System'

British Pat. No. 1,292,772 (IBM) 'Code Conversion Apparatus'

U.S. Pat. No. 3,717,851 (IBM) 'Processing of Compacted Data'

U.S. Pat. No. 3,694,813 (IBM) 'Method of Achieving Data Compaction Utilizing Variable Length Dependent Coding Techniques'

U.S. Pat. No. 3,883,847 (Bell Telephone Laboratories) 'Uniform Decoding of Minimum Redundancy Codes'

The common characteristic of the prior art cited above is that the bit strings to be encoded are of variable length. This leads to the use of fairly complex algorithms or large tables to achieve compression of the strings. In the character graphic display system described in our copending U.S. patent application Ser. No. 189,526, filed Sept. 22, 1980 pictures to be displayed on a display device are made up of a plurality of rows of character cells. Each character cell is defined in a central processing unit and transmitted to the display device as a bit string. The processing power in the display controllers is not very large compared with the central processing unit and storage for decompression tables is limited if not non-existent. Consequently, any compression technique used on the bit strings would have to use only limited processing and preferably not require the use of tables. A characteristic of the character cell definitions is that if the rows of pel bits are divided into groups, then patterns of digits recur; in order to achieve a compression using limited processing the present invention makes use of this repetition.

SUMMARY OF THE INVENTION

According to the present invention there is provided a method of compressing binary bit strings of a predetermined length by the steps of:

(a) dividing a bit string into a predetermined number of digits, (b) comparing the bit string with a first comparison string and counting and storing the number of digits in which a mismatch occurs, (c) comparing the bit string with a second comparison string and counting and storing the number of digits in which a mismatch occurs, (d) choosing as a comparison string that which provided the least mismatches of digits, (e) generating a header code indicting which comparison string has been chosen, and (f) generating a string of binary bits having a single flag bit for each successful digit comparison and a flag bit plus the full digit for each non-successful digit comparison.

BRIEF DESCRIPTION OF THE DRAWINGS

In order that the invention may be fully understood it will now be described by way of example with reference to the accompanying drawings in which:

FIG. 6 is a diagrammatic representation of a character cell definition bit string.

PREFERRED EMBODIMENT

Figure 1:
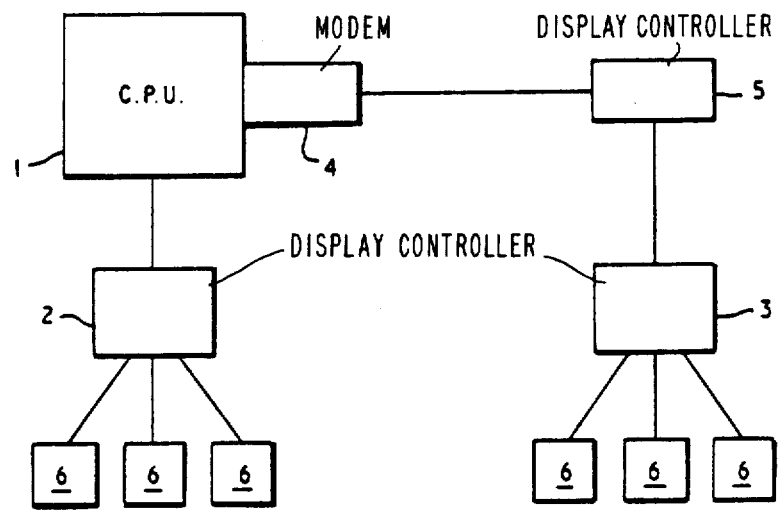
FIG. 1 is a block diagram of the components of a digital data display such as described in our aforementioned application.

Referring now to FIG. 1 there is shown a central processing unit 1 which may, for example, be an IBM System 370/168 (IBM is a Registered Trade Mark). The central processing unit 1 performs the main processing tasks required to control the display system and also for processing display information such as the generation of character cell definitions as described in the aforementioned copending application. The central processing unit may have a direct connection to a display controller 2 and/or may be remotely connected to a display controller 5 which in turn may be connected to several display controllers 3. (Only one shown).

Each of the display controllers controls a plurality of display devices 6. The display devices usually comprise a visual display unit such as a cathode ray tube and a separate keyboard by which a user enters commands into the system.

Figure 2:
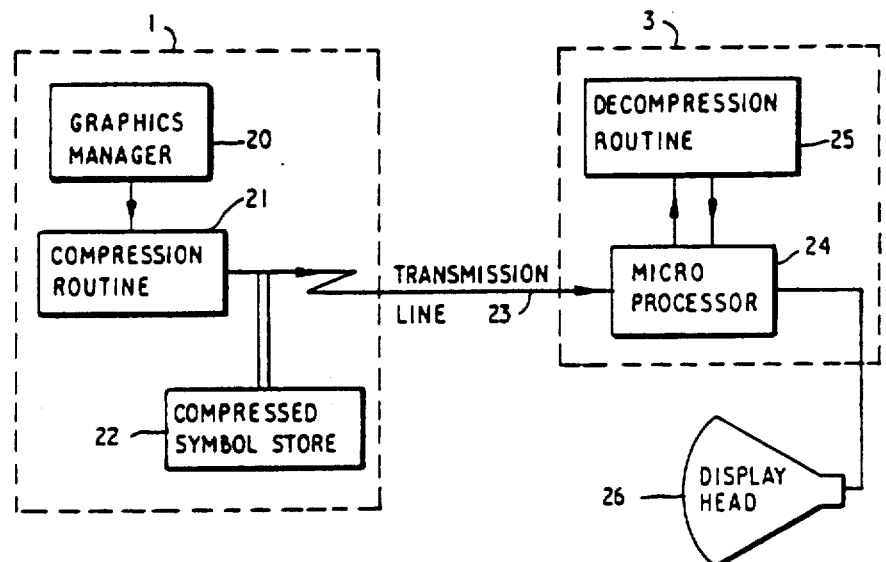
FIG. 2 is a block diagram showing the apparatus used in the present invention.

FIG. 2 shows in schematic form the apparatus for implementing the present invention. The central processing unit 1 includes a graphics manager 20 which generates character cell definitions as described in the aforementioned copending application. Compression routines 21 are stored in program or microprogram form in the central processing unit and control the compression of the bit strings generated by the graphics manager as will be described below. The compressed bit strings may be stored in a compressed symbol store 22 before being transmitted via transmission line 23 to a display controller 3.

The display controller 3 includes a microprocessor 24 and a microprogram store 25 which includes decompression routines which control the decompression of the bit strings. The decompressed bit strings are then transmitted to a display head 26 where they are stored in random access memories as described in the aforementioned copending application.

The display controller 3 and the display head 26 may be included in one physical box as in the IBM 8775 display unit, they are shown separately in FIG. 2 for ease of understanding.

In the preferred embodiment of the present invention the bit string of a character cell definition is divided into a number of slices and each slice is then divided into a number of digits. In a 9×16 pel array the number of slices is 9 and there are 4 digits of 4 bits each in each slice. Each slice is then compared with the previous slice in the string (the first with all zeros), the previous slice but one (the first two with all zeros) or with an all zero slice and a code based on the following rules is generated.

| For the slice: | 0 | if all digits match |
|---|---|---|
| | 1 | if there is one or more mismatches |
| For each digit in a mismatch slice: | | |
| | 0 | if the digit matches |
| | 1xxxx | where xxxx is the digit where a mismatch occurs |

Thus if a slice with a pattern 0010.0000.0101.0000 is compared with all zeros the result would be 1100100101010.

In the particular embodiment of the invention no two character cell definitions or bit strings are the same, as for each picture a cell definition is only transmitted once, and thus, there is no provision for indicating identical bit strings, although in another embodiment this could be done.

The comparison with all zeros, slice-1 or slice-2 is constant for each character cell definition bit string and is indicated by a header digit to the compressed string.

| 0 | for comparing all slices with all zeros, |
|---|---|
| 10 | for comparing with slice-1, |
| 110 | for comparing with slice-2, |
| 1110 | if the bit string is all zeros or blanks. |

The decision as to which comparison to use is made by doing an initial comparison with the digits to be sent and counting the mismatches. The comparison giving the least mismatches is then used. If there is a tie then the comparison with the smallest header digit is used, i.e., all zeros before slice-1, before slice-2.

The counting of mismatches is done by first counting the number of digits which include at least one '1', secondly performing an Exclusive-Or function on the bit string with itself shifted to the right by one slice (2 bytes) and counting the resulting number of digits which include at least one '1', and thirdly performing an Exclusive-Or function on the bit string with itself shifted to the right by two slices (4 bytes) and counting the resulting number of digits which include at least one '1' and then choosing the comparison which yields the lowest count.

Figure 3:
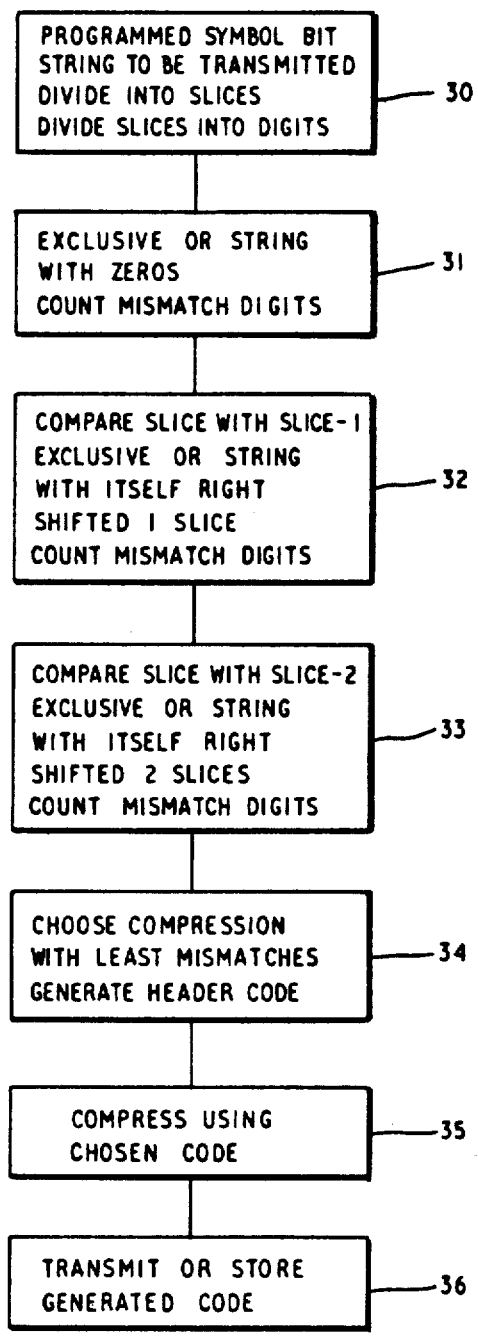
FIGS. 3, 4 and 5 are flowcharts illustrating the operation of the compressing and decompressing of bit strings.
Figure 4:
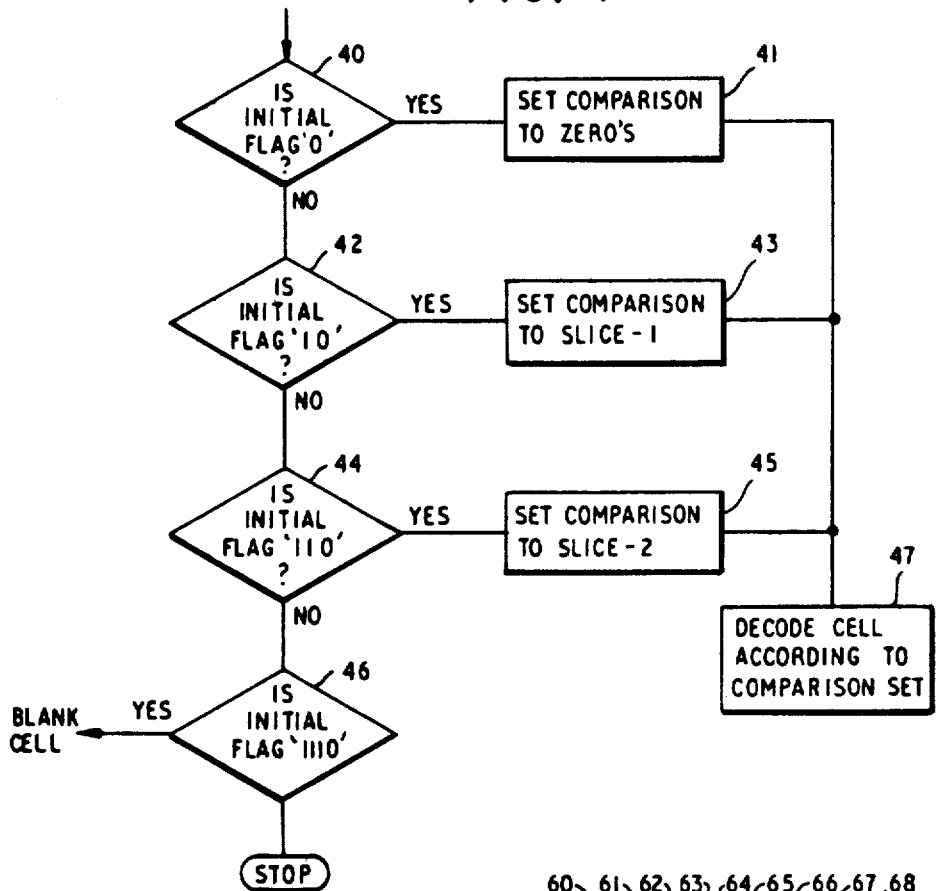
Figure 5:
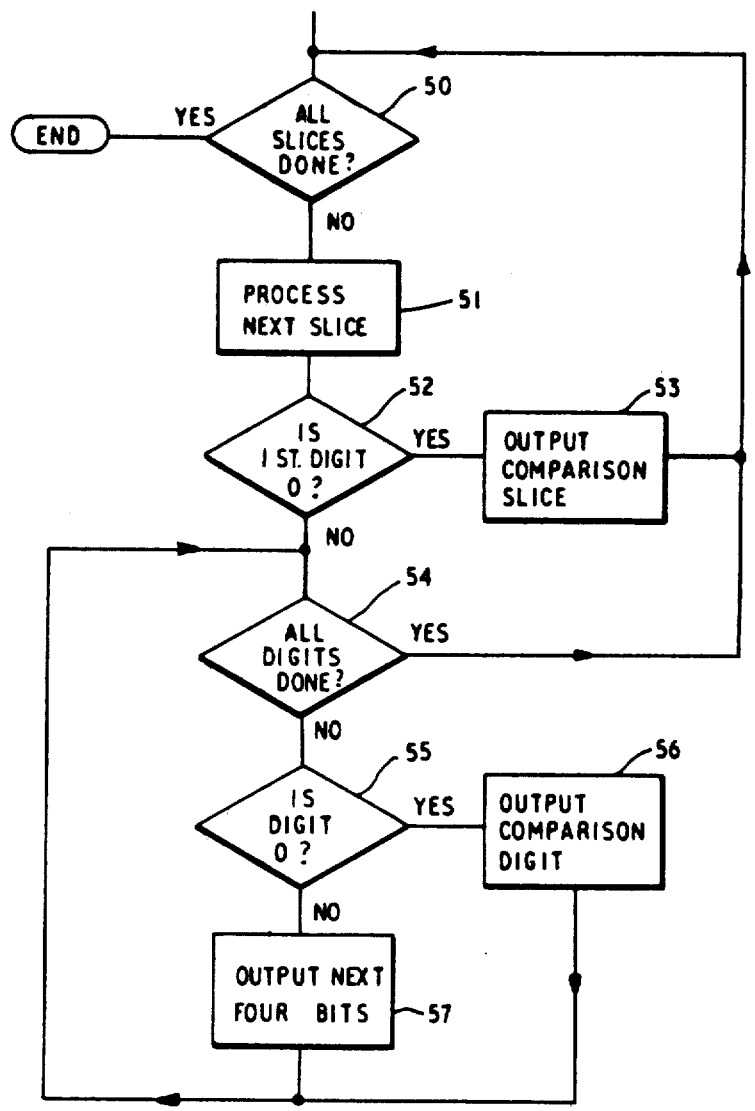

The compression technique may be implemented by logic circuitry but in the preferred embodiments the implementation is by microprograms which control the central processing unit and the microprocessor in the display controller to perform the method illustrated in the flowcharts of FIGS. 3, 4 and 5.

FIG. 3 shows in general terms the steps to be taken when a bit string is compressed. Step 30, the first step, is to recognize that a bit string is to be transmitted and to divide the string into the predetermined number of slices and then each slice into the predetermined number of digits. (In the example, 9 slices and 4 digits.) The second step 31 is to count and store the number of zero digits.

The third step 32 is to perform an Exclusive-Or function on the string with itself shifted right 1 slice or 2 bytes, with the leftmost slice in the shifted string being filled with blanks or zeros. The mismatch digits are again counted and the number stored.

The fourth step 33 is similar to step 32 except the string is right shifted 2 slices or 4 bytes and the leftmost two slices are filled with blanks or zeros.

The fifth step 34 is to choose the comparison slice for the compression routine according to which yielded the least mismatches. If there was an equal number then the comparison is chosen as detailed above. The sixth step 35 is to perform the compression according to the rules stated above, and finally at step 36 the compressed string is transmitted or if necessary stored awaiting transmission.

Of course, if the number of mismatches between digits for all three comparison slices is more than 75% of the total, then compression by this technique does not gain anything, but in the practical embodiment of character cell definitions it is found most cells have a considerable number of blanks or zeros and the number of mismatches is seldom more than 40%.

FIG. 4 shows the method used at the display controller for deciding which comparison slice is to be used for decoding. The first step 40 is to decide if the initial header bit or flag is zero. If yes, then step 41 is entered and the comparison slice is to be a string of zeros. If not, then the decision step 42 is entered and the header is examined to see if it is '10'. If yes, then step 43 is entered and the comparison slice is to be the slice-1. If not, then decision step 44 is entered and the header is examined to see if it is '110'. If yes, then step 45 is entered and the comparison slice is to be the slice-2. If not, the decision step 46 is entered and the header examined to see if it is '1110' and that the string is all zeros, or a blank cell. When the comparison slice to be used is discovered, then the remaining string is decoded at step 47 as expanded in the flowchart of FIG. 5.

FIG. 5 is an expansion of the step 47 of FIG. 4. At step 50 the decision is taken as to whether any more slices have to be processed, if not, then the current bit string is complete and the routine ends, if not then step 51 is entered and the next slice is processed. The next decision to be taken is whether the first digit is 0 at step 52. If the answer is yes, then step 53 is performed and the comparison slice is output and step 50 re-entered.

If the first digit is not 0, then step 54 is entered and the string examined to see whether there are any more digits to process. If the answer is that there are no more digits in the slice, then step 50 is re-entered, if not, step 55 is entered.

At step 55 the next digit to be processed is examined to see if it is a 0. If the answer is yes, then at step 56 the comparison digit is output and step 54 re-entered. If the answer is no, then the 1 bit that was examined is discarded as a flag and the next four bits are output to the decompressed string. After that step 54 is again re-entered. This process will continue to all digits of all the slices have been processed and the routine ends.

FIG. 6 shows, by way of example, a character cell definition in a 9×16 array and in order to help in understanding the present invention the compression of the bit string will be explained.

The character cell definition is divided into nine slices 60–68 each having four digits A, B, C and D. Each digit has four bits and may be represented by a hexadecimal digit. Thus, the cell of FIG. 6 may be represented as:

|   | 60 | 61 | 62 | 63 | 64 | 65 | 66 | 67 | 68 |
|---|----|----|----|----|----|----|----|----|----|
| A | 1  | 0  | 0  | 0  | 0  | 0  | 0  | 0  | 0  |
| B | 0  | 8  | 4  | 2  | 1  | 0  | 0  | 0  | 0  |
| C | 1  | 1  | 1  | 1  | 1  | 9  | 5  | 3  | 1  |
| D | 0  | 0  | 0  | 0  | 0  | 0  | 0  | 0  | 0  |

By observation it can be seen that when each slice 60–68 is compared with all zeros the number of digit mismatches is 14.

If each slice is compared with the previous slice, the number of digit mismatches is 12.

If each slice is compared with the previous slice-2, then the number of digit mismatches is 14.

The compression comparison chosen is therefore with the previous slice.

As no two slices are the same then each will be preceded by a 1 and the initial header will be '10'.

Slice 60 will be compared with all zeros and when the comparison is performed the output string will be: 10.1.10001.0.10001.0. The first two bits being header information, the next bit indicating the slice is not the same as the comparison, the next four bits being digit A, the next bit indicating digit B is the same as the comparison, the next four bits being digit C, and the next bit indicating that digit D is the same as the comparison.

Comparing slice 61 with 60 provides the following string: 1.10000.11000.0.0. The stops indicating the boundary between digits.

The total bit string for the compression of the cell of FIG. 6 is:
10.1.10001.0.10001.0.1.10000.11000.0.0.1.0.10100.
0.0.1.0.10010.0.0.1.0.10001.0.0.1.0.10000.11001.0.1.0.0.
10101.0.1.0.0.10011.0.1.0.0.10001.0.

This may be written in hexadecimal as B145860A8522894329549A44.

This is twenty four hex digits as opposed to the uncompressed thirty six.

Because of the characteristic of character cell definitions, most cells will only represent a single line and will consequently have many more repeating slices and digits. Obviously if in FIG. 6 the diagonal line was left out, the compression of the slices would have been 1010.0100.0100.0000.000.

Where the last eight zeros indicate that the slices 61–68 are the same as slice 60.

The compression achieved by the technique significantly reduces the time it takes to transmit cell definition from the central processing unit to a display unit and consequently enhances the user's view of the system, as the wait time between picture displays is also reduced.

While the invention has been particularly shown and described with reference to preferred embodiments thereof, it will be understood by those skilled in the art that various changes in form and detail may be made therein without departing from the spirit and scope of the invention.

Having thus described our invention, what we claim as new, and desire to secure by Letters Patent is:

1. A method for compressing a binary bit string of a predetermined length comprising the steps of:
    (a) dividing the bit string into a predetermined number of slices, each slice having a predetermined number of digits comprising a predetermined number of binary bits,
    (b) comparing the bit string with a first comparison string of identical binary bits, and counting and storing the number of digits in which a mismatch occurs,
    (c) comparing the bit string with at least a second comparison string which is the string to be compressed shifted by one slice so that each slice, except the first is compared with the previous slice in the string, and counting and storing the number of digits in which a mismatch occurs,
    (d) choosing as a coding basis that comparison string which provided the least number of mismatches of digits,
    (e) generating a header code indicating which comparison string has been chosen, and
    (f) generating a string of binary bits having a single flag bit for each successful digit comparison and a different flag bit plus the full digit for each non-successful digit comparison.

2. A method for compressing a binary bit string as set forth in claim 1 including a third comparison step in which a third comparison string is utilized which is the bit string to be compressed shifted by two slices so that each slice except for the first two slices, is compared with the two previous slices in the string.

3. A method for compressing a binary bit string as set forth in claim 2 further including the step of determining if an equal number of mismatches has occurred for two or more comparison strings, the one chosen depends upon the length of the associated header code.

4. A method for compressing a binary bit string as set forth in claim 3 including generating only a single flag bit and no digit bits whenever a slice to be compressed exactly matches the comparison slice and an opposite binary state flag bit whenever a mismatch occurs.

5. A digital data display system in which character cell definition bit strings are generated in a central processing unit and transmitted to a display unit including a central processing unit which includes means for compressing bit strings representing digital scan data comprising the information to be displayed said last named means comprising:
    means for dividing each bit string to be coded into a predetermined number of slices, each slice having a predetermined number of digits,
    means for comparing the bit string to be coded with a plurality of comparison strings,
    means for selecting as a first comparison string, a string of identical binary bits,
    means for selecting as a second comparison string the string to be compressed shifted by one slice and
    means for selecting as a third comparison string the bit string to be compressed shifted by two slices and
    means for comparing the bit string to be coded with each of said three comparison strings and counting and storing, for each comparison string, the number of digits in which a mismatch occurs, means for choosing as a coding base that comparison string which provided the least number of mismatches of digits, means for generating a header code for indicating which comparison string has been chosen, and means for generating a string of binary bits having a single flag bit for each successful digit comparison and a flag bit plus the full digit for each non-successful digit comparison.

6. A digital display system as set forth in claim 5 including means for determining if an equal number of mismatches occurs for two or more comparison strings and means for choosing the actual comparison string based on the length of the associated header code designating that string.

* * * * *